US006421297B1

(12) United States Patent
Huber (10) Patent No.: US 6,421,297 B1
(45) Date of Patent: Jul. 16, 2002

(54) DATA-PATTERN-DEPENDENT COMPENSATION TECHNIQUE TO MAINTAIN DRIVE STRENGTH OF AN OUTPUT DRIVER

(75) Inventor: Brian W. Huber, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/862,790

(22) Filed: May 21, 2001

(51) Int. Cl.$^7$ ................................................ G11C 8/00
(52) U.S. Cl. .............................. 365/230.06; 365/189.05
(58) Field of Search ........................ 365/189.05, 230.06, 365/189.07, 189.06

(56) References Cited

U.S. PATENT DOCUMENTS 5,537,070 A   7/1996  Risinger ..................... 327/170
6,140,718 A * 10/2000  Suder et al. ................. 307/412
6,310,809 B1 * 10/2001  Roohparvar et al. ... 365/185.13

* cited by examiner

Primary Examiner—David Nelms
Assistant Examiner—Thong Le
(74) Attorney, Agent, or Firm—Fletcher, Yoder & Van Someren (57) ABSTRACT

The drive strength of an output driver is maintained substantially constant regardless of the pattern of data provided to an output bus. The output driver includes a plurality of drive elements coupled to a shared voltage bus and a data-pattern-dependent compensation circuit. To compensate for variations in drive strength induced by data pattern changes which introduce changes in the voltage applied to the driver elements by the shared voltage bus, the compensation circuit selectively couples compensation elements in parallel with the driver elements to change their resistance. Thus, drive strength for each driver element is maintained substantially constant regardless of the data pattern.

28 Claims, 8 Drawing Sheets

DATA-PATTERN-DEPENDENT COMPENSATION TECHNIQUE TO MAINTAIN DRIVE STRENGTH OF AN OUTPUT DRIVER

BACKGROUND OF THE INVENTION

1. Field of the Invention

The present invention generally relates to output drivers in an integrated circuit, such as a memory device, and more particularly, to compensation for changes in voltage applied to each driver element due to varying output data patterns, such that the output current is maintained at a target level.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Integrated circuits typically include multiple outputs at which various types of signals are provided. Integrated circuits, such as memory devices (e.g., SRAMs, DRAMs), also typically include output drivers to drive output signals onto an output bus. Many such output drivers include open-drain or open-collector drive elements. When a logic HIGH level data output signal is on the output bus, the output drive element (e.g., a FET, a BJT, etc.) is in a non-conductive state. To provide a logical LOW level signal on the output bus, the driver element is placed in a conductive state such that an output current flows on the output bus. For many integrated circuit applications, it may be desirable to maintain this output current (i.e., the drive strength of the driver element) very close to a particular target level under all operating conditions.

Maintaining the output current close to the target level may be difficult if the integrated circuit includes multiple outputs. Often, the multiple output drive elements are connected to a shared voltage bus that provides power to the driver. If multiple drive elements are connected to the shared bus, the trace length may be long enough such that output-signal-dependent voltage drops are introduced on the bus. Depending on the size of the shared bus, the voltage drops experienced by a drive element may be substantial enough to affect the amount of output current that can be provided by that drive element. Further, the voltage drop experienced by any one driver element may vary depending on how many other drive elements simultaneously are in a conductive state. As a result, the output current provided by each drive element is related to the pattern of the output data signals provided at the outputs of the integrated circuit. Such data-pattern-dependent variations in output current provided by the various driver elements may be undesirable because they may result in weak data signals on the output bus, leading to potential data errors.

Techniques for reducing data-pattern-dependent variations in output driver current include eliminating or curtailing sharing of a given voltage bus. Alternatively, a large bus (i.e., low resistance) may be provided such that voltage drops are minimized. Unfortunately, such solutions can lead to significant increases in the size of the integrated circuit. For applications in which minimization of circuit size is desirable, increasing the size of the shared bus or reducing bus sharing may not be viable alternatives.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
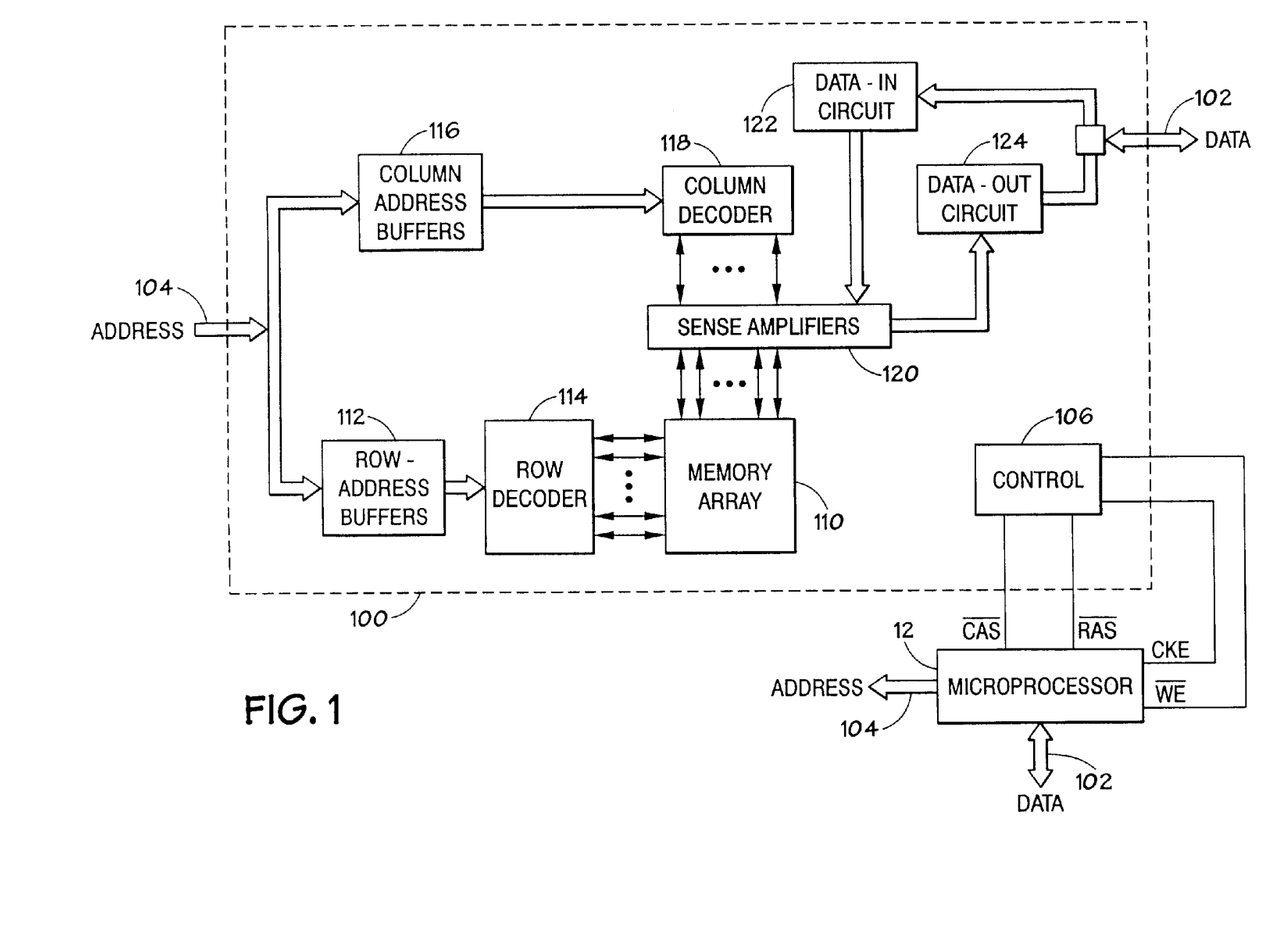
FIG. 1 illustrates a block diagram depicting an exemplary embodiment of a memory circuit, such as a DRAM.

Turning now to the figures and initially referring to FIG. 1, a block diagram depicting an exemplary embodiment of a memory circuit 100, such as a dynamic random access memory (DRAM), is illustrated. The description of the DRAM 100 has been simplified for illustrative purposes and is not intended to be a complete description of all features of a DRAM. The present system is not limited to DRAMs, and is equally applicable to other random access memory devices, as well as other integrated circuit devices having output drivers, which may benefit from maintaining output drive current at a particular level. Those skilled in the art will recognize that a wide variety of devices may be used in the implementation of the present invention. Further, those skilled in the art will recognize that the following discussion of the invention, as it may be implemented in a DRAM, is intended merely to facilitate an understanding of the invention.

Control, address, and data information provided over a memory bus are represented by individual inputs to the DRAM 100. These individual representations are illustrated by a data bus 102, address lines 104, and various discrete lines directed to control logic 106. As is known in the art, the DRAM 100 includes a memory array 110, which comprises rows and columns of addressable memory cells. Each memory cell in a row is coupled to a word line. Additionally, each memory cell in a column is coupled to a bit line. Each cell in the memory array 110 typically includes a storage capacitor and an access transistor as is conventional in the art.

The DRAM 100 interfaces with, for example, a microprocessor 12 through address lines 104 and data lines 102. Alternatively, the DRAM 100 may interface with a DRAM controller, a microcontroller, a chip set, or other electronic system. The microprocessor 12 also may provide a number of control signals to the DRAM 100. Such signals may include row and column address strobe signals RAS/ and CAS/, a write enable signal WE/, a clock enable signal CKE, and other conventional control signals. The control logic 106 controls the many available functions of the DRAM 100. In addition, various other control circuits and signals not detailed herein contribute to the DRAM 100 operation as known to those of ordinary skill in the art.

A row address buffer 112 and a row decoder 114 receive and decode row addresses from row address signals provided on the address lines 104. Each unique row address corresponds to a row of cells in the memory array 110. The row decoder 114 typically includes a word line driver, an address decoder tree, and circuitry which translates a given row address received from row address buffers 112 and selectively activates the appropriate word line of the memory array 110 via the word line drivers.

A column address buffer 116 and a column decoder 118 receive and decode column address signals provided on the address lines 104. The column decoder 118 also determines when a column is defective and the address of a replacement column. The column decoder 118 is coupled to sense amplifiers 120. The sense amplifiers 120 also receive inputs from complementary pairs of bit lines of the memory array 110.

The outputs of the sense amplifiers 120 are coupled to data-in (i.e., write) circuitry 122 and data-out (i.e., read) circuitry 124. During a write operation, the data bus 102 provides data to the data-in circuitry 122. The sense amplifier 120 receives data from the data-in circuitry 122 and stores the data in the memory array 110 as a charge on a capacitor of a cell at an address specified on the address line 104. In one embodiment, the data bus 102 includes eight data lines to implement an 8-bit data bus carrying data at 400 MHz or higher.

During a read operation, the DRAM 100 transfers data (e.g., 8 bits) to the microprocessor 12 from the memory array 110. During a pre-charge operation, complementary bit lines for the accessed cell are equilibrated to a reference voltage provided by an equilibration circuit and a reference voltage supply. The charge stored in the accessed cell is then shared with the associated bit lines. The sense amplifier 120 detects and amplifies a difference in voltage between the complementary bit lines. Address information received on address lines 104 selects a subset of the bit lines and couples them to complementary pairs of input/output (I/O) wires or lines. The I/O wires pass the amplified voltage signals to the data-out circuitry 124, which includes a driver for each data line to drive the output data signals out to the data bus 102.

Figure 2:
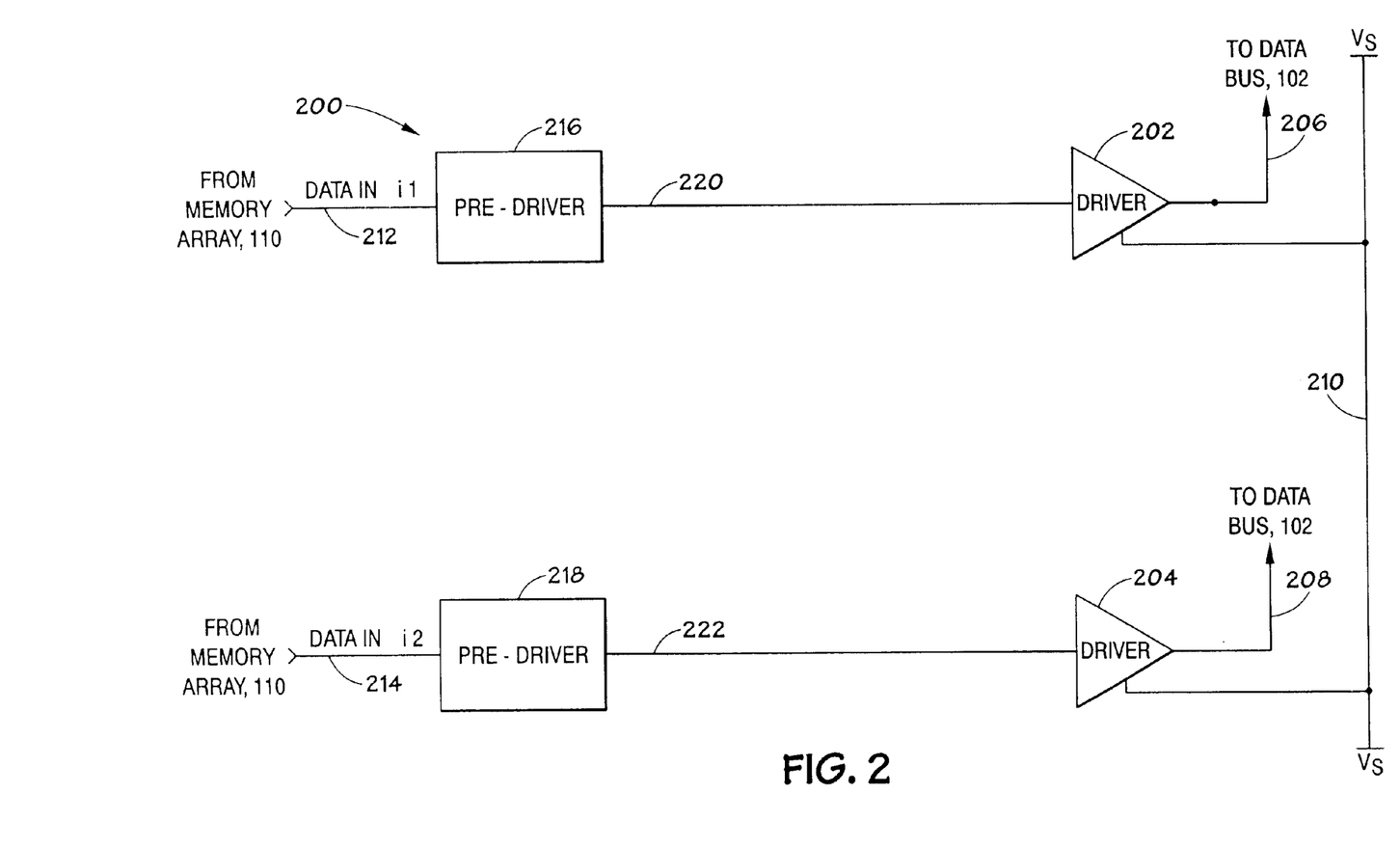
FIG. 2 illustrates a block diagram of an exemplary driver circuit.

FIG. 2 illustrates a block diagram of an exemplary driver circuit 200 that may be implemented in the output data circuitry 124 of the DRAM 100. In the illustration of FIG. 2, two output driver elements 202 and 204, which drive two data output lines 206 and 208 of the data bus 102 are illustrated. The two output driver elements 202 and 204 both are coupled to a shared voltage bus 210 ($V_s$), which provides power to the driver elements. It should be understood, however, that the output data circuitry 124 of a memory device 100 may include more than two output driver elements. It should be further understood that more than two output driver elements may be coupled to the shared voltage bus 210.

As discussed above, data read from the memory array 110 is provided to the output data circuitry 124. With reference to FIG. 2, two data lines 212 and 214 provide data signals $i_1$ and $i_2$ to pre-drivers 216 and 218, respectively. The pre-drivers 216 and 218 may include logic, multiplexors, buffers, etc. as may be necessary to provide the appropriate drive signals on lines 220 and 222 to the driver elements 202 and 204 to drive the data signals out to the data bus 102. Generally, the data signals either are a logic LOW signal (i.e., logical "0") or a logical HIGH signal (i.e., logical "1").

In an exemplary embodiment, the driver elements 202 and 204 are FETs having an open drain configuration. Thus, when a logical LOW data signal is to be driven out to the data bus 102, the pre-driver 216 or 218 provides a gate threshold voltage on line 220 or 222 to place the driver element 202 or 204 in a conductive state. In this state, output current flows from the data bus 102, through the driver elements 202 or 204, and onto the shared voltage bus 201. The current flow on the shared voltage bus 210 results in voltage drops on the shared bus due to the resistance of the shared bus. Consequently, the voltage applied by the shared voltage bus 210 at each of the driver elements 202 and 204 may be different than the shared bus voltage applied to the other driver element. Further, the voltage seen at any one of the driver elements may vary depending on the amount of current flowing on the shared voltage bus 210. Thus, the voltage applied to the driver elements 202 and 204 from the shared voltage bus 210 may differ as the pattern of data signals on the data bus 102 varies. Because the voltage applied to the driver elements 202 and 204 may differ, the output current on the data bus 102 and shared bus 210 also may differ, preventing the driver elements from providing strong LOW level signals on the bus 102 that can be seen by other devices on the bus.

To minimize the data-pattern-dependent variations in output current, the data-pattern-dependent variations in supply voltage can be compensated. In the exemplary embodiment, such compensation is effected by varying the resistance of the driver elements 202 and 204 based on the pattern of the output data. Thus, if the resistance of the driver element is decreased when a larger voltage drop is introduced (i.e., when a ground bus at the driver element (i.e., the local shared bus 210) is higher than at the ground bus supply), then the same amount of current may be provided by the driver element despite the drop in voltage.

Figure 3:
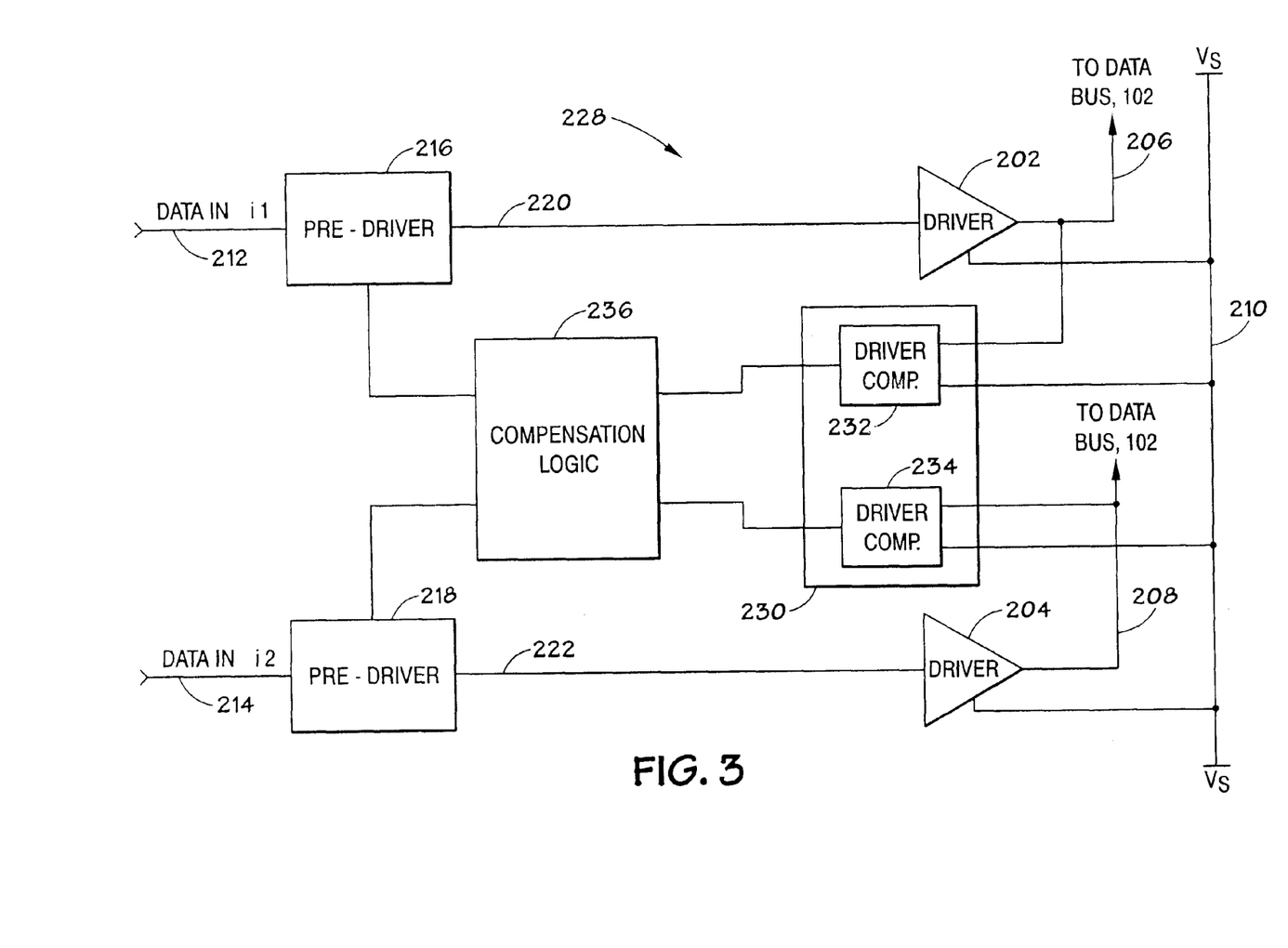
FIG. 3 illustrates a block diagram of a driver circuit, such as the driver circuit of FIG. 2, with exemplary data-pattern-dependent compensation circuitry, in accordance with the invention.

FIG. 3 illustrates a block diagram of a drive circuit 228 with circuitry to compensate for the effects on output current caused by data-pattern-dependent voltage variations on the shared voltage bus. The compensation circuitry includes a driver compensation circuit 230 having driver compensation elements 232 and 234 that selectively can be connected in parallel with driver elements 202 and 204, respectively. The compensation circuitry further includes compensation logic 236, which selectively drives the driver compensation circuit 230 based on the pattern of the data being provided to the data bus 102.

As illustrated in FIG. 3, the compensation logic 236 receives inputs from each of the pre-drivers 216 and 218. The inputs are representative of the data ($i_1$ and $i_2$) being read from the memory array. Based on these inputs, the compensation logic 236 provides an output to the driver compensation circuit 230 to connect the driver selectively to compensation elements 232 and 234 in parallel with the driver elements 202 and 204, respectively.

In an exemplary embodiment, the driver compensation elements 232 and 234 compensate for the voltage drops on the shared bus 210 by decreasing the resistance of the driver elements 202 and 204, thus maintaining the output drive current on data bus 102 substantially constant (e.g., within a range of +/−1%) regardless of the output data pattern. That is, by varying the resistance (i.e., the size) of the driver elements 202 and 204 in an appropriate relationship to the variations in the amount of voltage applied to the driver elements 202 and 204 by the shared bus 210, the output drive current on data bus 102 can be maintained at or near a desired level.

For example, to determine the appropriate size for each of the compensation elements 232 and 234, the driver elements 202 and 204 and the topology of the shared bus 210 may be modeled and a simulation run with various data patterns. Once the simulation demonstrates the amount of current lacking on the data bus 102 for a particular data pattern (e.g., the worst case data pattern), then the compensation elements 232 and 234 may be sized in a proportional relationship to the difference in output current from a target value. For example, if the target value for the output current for a particular driver element 202 or 204 is 30 mA, and the simulation shows that the actual current provided by the driver element 202 or 204 is only 27.3 mA (i.e., a 9% difference) for the worst case data pattern (i.e., both elements 202 and 204 are on simultaneously), then the size of the compensation element 232 or 234 for the particular driver element 202 or 204 is designed to be 10% of the size of the respective driver element 202 or 204.

Figure 4:
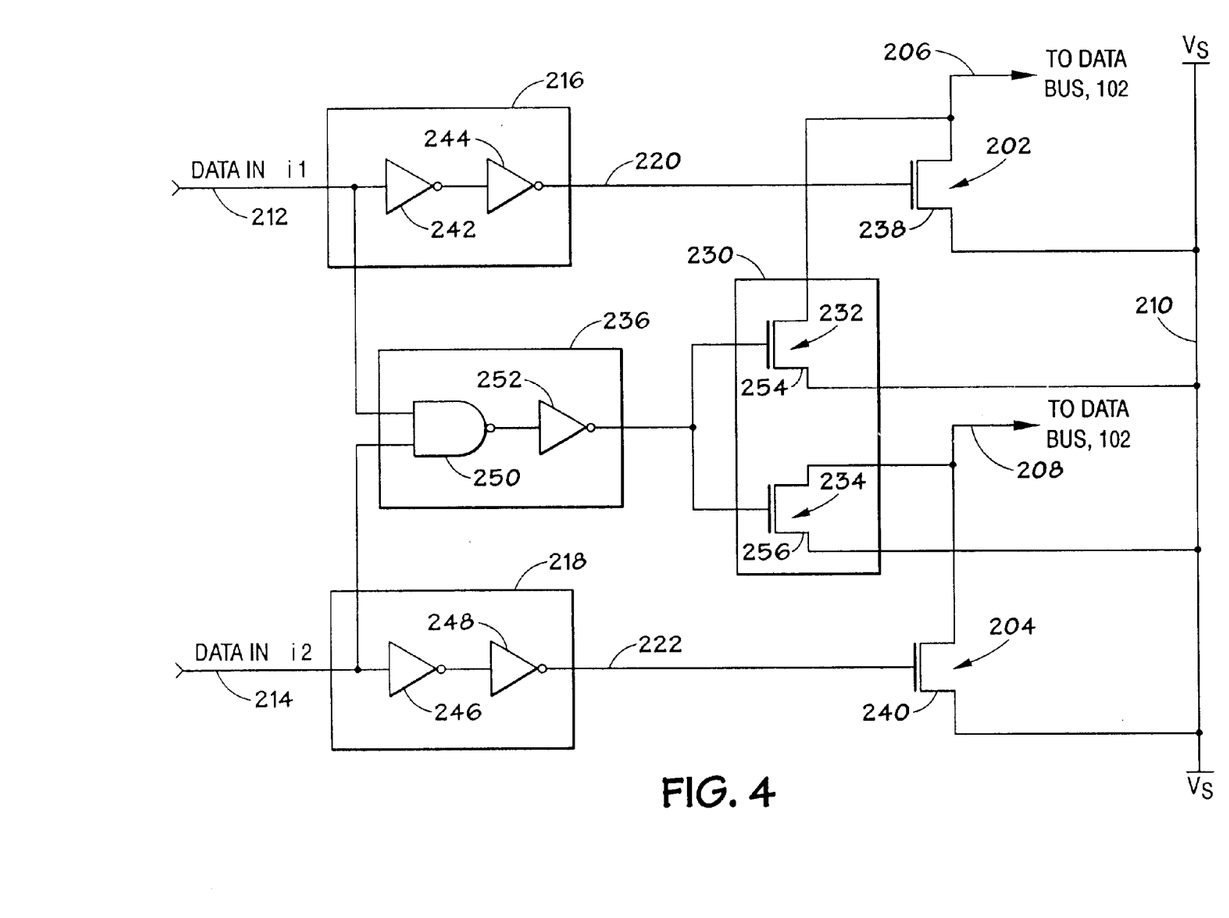
FIG. 4 illustrates an exemplary embodiment of the compensation logic of the driver circuit of FIG. 3 in accordance with the invention.

FIG. 4 illustrates one embodiment of the drive circuit 228 of FIG. 3, showing an exemplary configuration of the compensation logic 236 and the driver compensation circuit 230. In this configuration, driver elements 202 and 204 include FETs 238 and 240, which are configured as open drain drivers with their sources connected to the shared voltage bus 210. Pre-drivers 216 and 218 include inverter/buffers 242, 244, 246, and 248, which receive the Data In signals $i_1$ and $i_2$ from the memory array. The pre-drivers 216 and 218 appropriately condition the Data In signals to provide gate threshold voltage signals 220 and 222 to the FETs 238 and 240 to drive the data out to the output bus 102.

As can be seen from FIG. 4, depending on the pattern of the data read from memory, the driver circuit may be in any one of three states in which current is drawn from the output bus 102 and flows on the shared bus 210: (1) only FET 238 is ON (i.e., in a conductive state); (2) only FET 240 is ON; or (3) FET 238 and FET 240 are ON simultaneously. Assuming that the topology of the shared bus 210 is such that substantially the same level of voltage is applied to FET 238 when only it is ON as is applied to FET 240 when only it is ON, then the compensation logic may be configured to provide compensation only in the case in which FET 238 and FET 240 are ON simultaneously. Thus, in the exemplary embodiment illustrated in FIG. 4, the compensation logic 236 is configured as a NAND gate 250 and inverter/buffer 252 to selectively connect the driver compensation elements 232 and 234 in parallel with FET 238 and FET 240, respectively, only when the data pattern is such that both FETs are ON simultaneously.

In the embodiment illustrated, the driver compensation elements are open-drain FETs 254 and 256. The size (i.e., width) of the FETs 254 and 256 is typically dependent on the amount of compensation desired, which, in turn, is typically dependent on the particular topology and physical size of the shared bus 210. In one embodiment, the FETs 238 and 240 each have a width of 520 microns. Thus, for a normal worst case data pattern (i.e., maximum current flow on the shared bus 210, which occurs when both FETs 238 and 240 are turned ON), the total width of the FETS coupled to the shared bus 210 may be 1040 microns. If the additional voltage drop for two FETs ON simultaneously causes the output drive to be 90% of the targeted value achieved when either FET 238 or 240 is ON individually, then each of the FETs 254 and 256 which are coupled in parallel with the FETs 238 and 240 are designed with a width that is 11.1% (i.e., 100*(100−90)/90) of the width of FETs 238 and 240.

Predicted practical implementations of the foregoing embodiment have demonstrated that the described compensation technique results in the ability to maintain output current for each driver element within a range of +/−1% of the targeted value, regardless of the data pattern. It should be understood that this particular embodiment has been described only for the purpose of demonstrating the compensation technique. In other embodiments, the driver FETs may have any of a variety of sizes, and each driver FET may be a different size than the other driver FETs.

Figure 5:
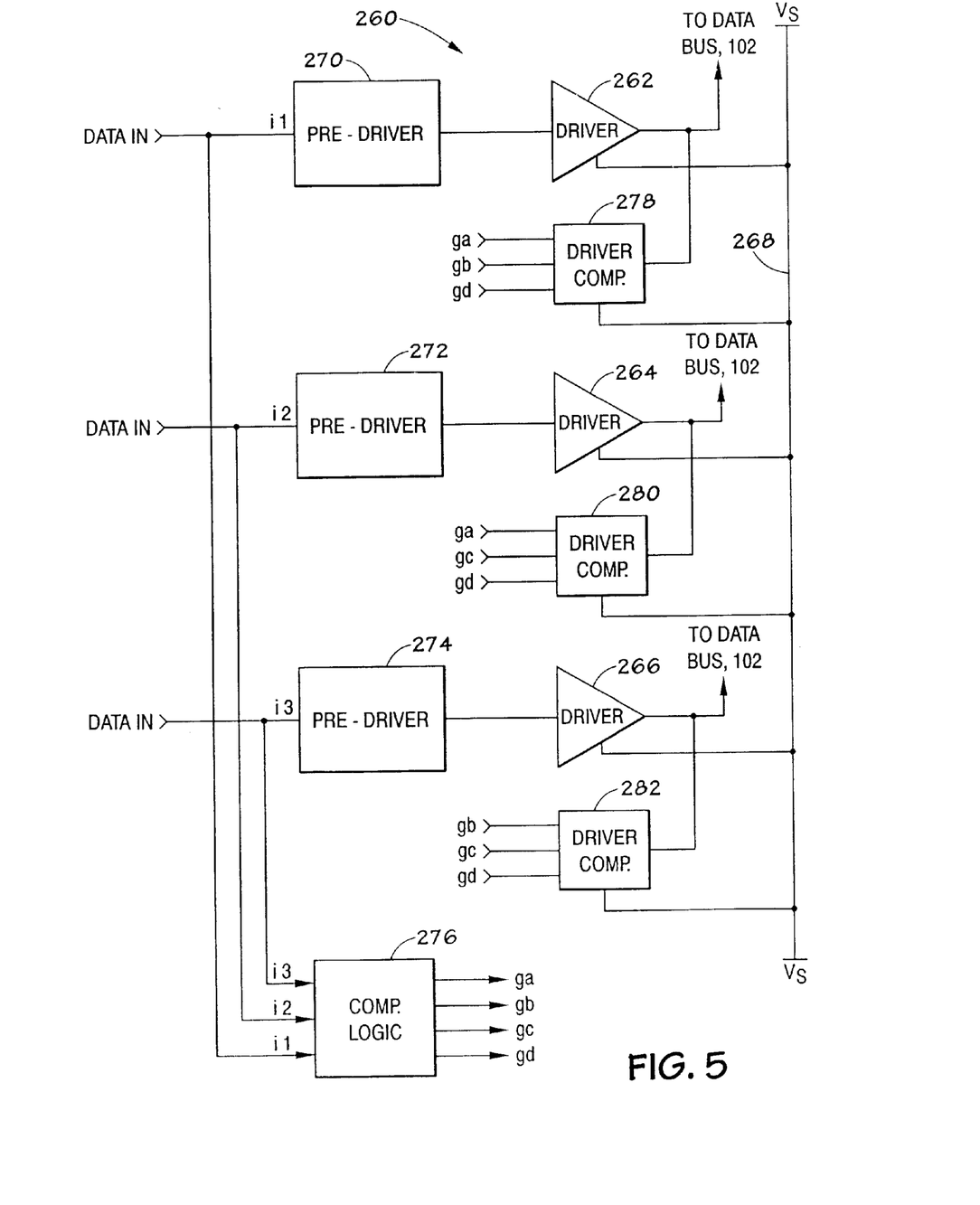
FIG. 5 illustrates a block diagram of another embodiment of a driver circuit including data-pattern-dependent compensation circuitry in accordance with the invention.

Further, it should be understood that FIG. 4 illustrates a simple configuration of a driver circuit. Other driver circuits may include a different number of driver elements connected to the shared bus, or the driver elements may have a different configuration, and thus the compensation circuitry may be adjusted accordingly. For example, FIG. 5 illustrates a driver circuit 260 having three driver elements 262, 264, and 266 coupled to a shared voltage bus 268. The driver circuit 260 farther includes pre-driver circuits 270, 272, and 274 for each of driver elements 262, 264, and 266, respectively.

In a manner similar to that described above, compensation logic 276 is provided to selectively couple driver compensation elements 278, 280, and 282 in parallel with the driver elements 262, 264, and 266 based on the pattern of the data being provided to the data bus 102. To provide data-pattern-dependent compensation, the compensation logic 276 receives data signals $i_1$, $i_2$, and $i_3$ which correspond to the data being read from the memory array. Based on the desired compensation (as determined by the size and topology of the shared voltage bus and the worst case normal data pattern), the compensation logic 276 provides an appropriate number of output signals, e.g., output signals $q_a$, $q_b$, $q_c$, and $q_d$, to the driver compensation elements 278, 280, and 282.

In the exemplary configuration illustrated in FIG. 5, $2^n-1$ (i.e., 7) states may exist in which current is drawn on the shared bus 268, where "n" is the number of driver elements connected to the shared bus 268. Of these states, "n" (i.e., 3) states exist in which only one of the driver elements is ON (i.e., in a conductive state). Compensation is not be provided for these "n" states. In the other $2^n-1-n$ (i.e., 4) states in which two or more driver elements are ON simultaneously, compensation may be desirable. Thus, an appropriate number of "legs" in each driver compensation element may be provided to compensate for the voltage drops experienced in each of the four different states based on which, and how many, of the driver elements are ON simultaneously.

Figure 6:
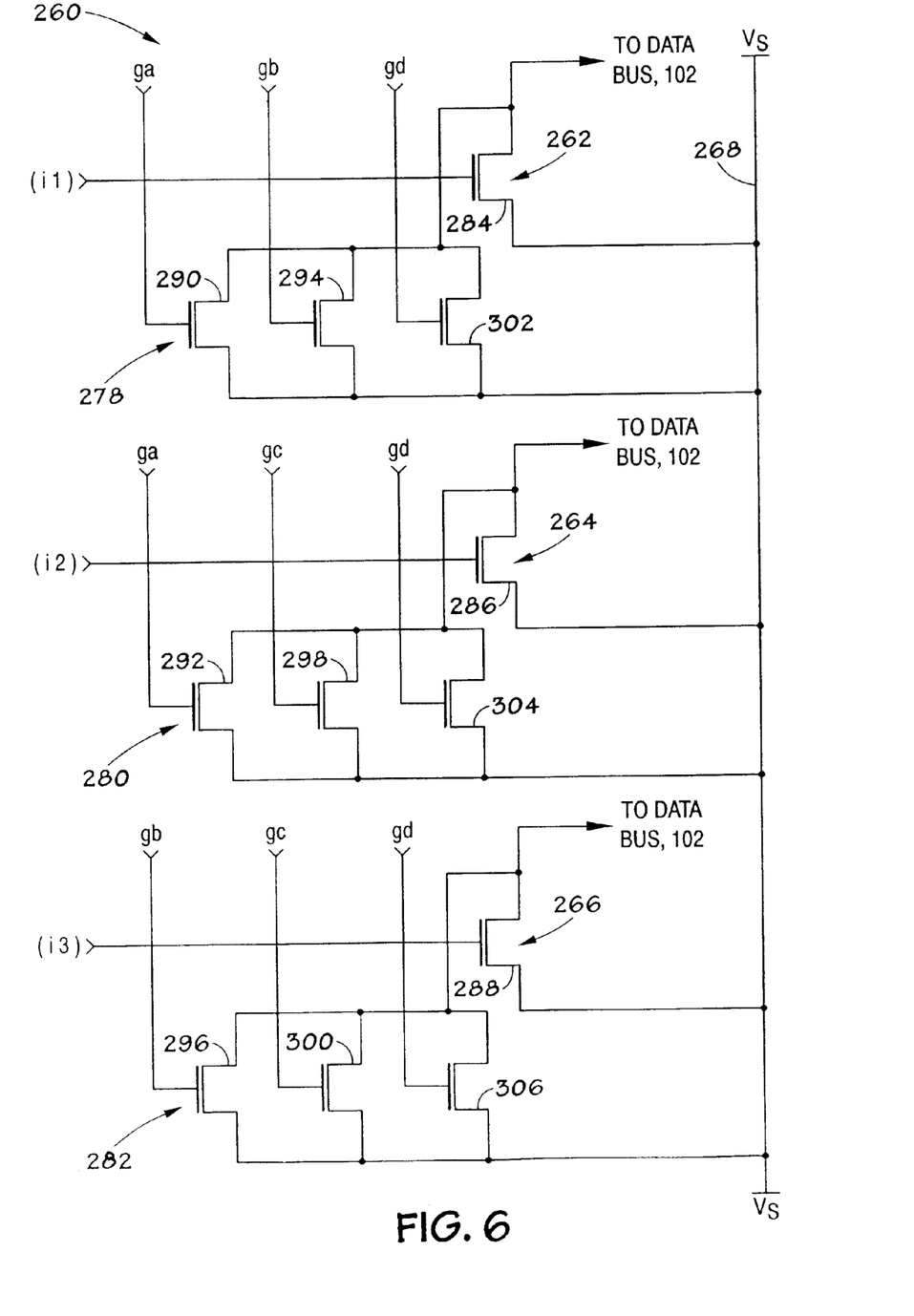
FIG. 6 illustrates an exemplary embodiment of driver compensation elements for the compensation circuitry for the driver circuit of FIG. 5.

FIG. 6 illustrates exemplary driver compensation elements 278, 280, and 282 for the driver circuit 260 shown in FIG. 5. As illustrated in FIG. 6, the driver elements 262, 264, and 266 are configured as open drain FETs 284, 286, and 288, and three compensation legs are provided in each driver compensation element 278, 280, and 282 to compensate for the changes in shared bus voltage applied to each driver element in the four different data pattern states. Each of the compensation legs is configured as an open-drain FET which is selectively connected in parallel with the corresponding driver element in response to the output signals ($q_a$, $q_b$, $q_c$, and $q_d$) provided by the compensation logic 276.

Figure 7:
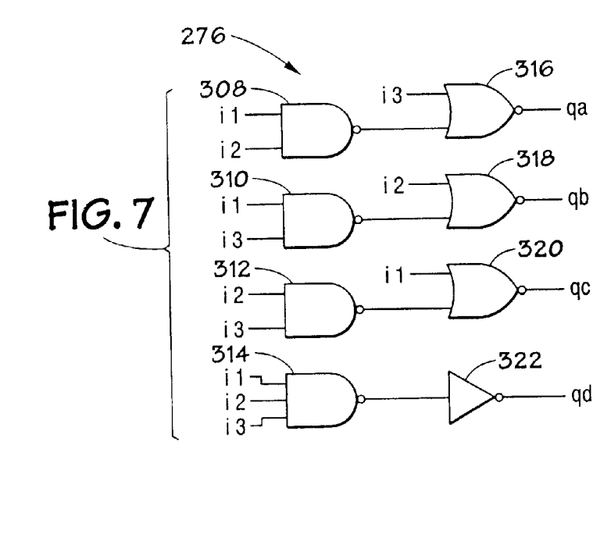
FIG. 7 illustrates an exemplary embodiment of compensation logic for the driver circuit of FIG. 5.

Exemplary compensation logic 276 for connecting the various legs in parallel with the driver elements 262, 264, and 266 is illustrated in FIG. 7. Input signals $i_1$, $i_2$, and $i_3$, representative of the pattern of data read from the memory array, are provided to NAND gates 308, 310, 312, and 314, NOR gates 316, 318, and 320, and inverter/buffer 322. In response to the input signals, the compensation logic 276 generates output signals $q_a$, $q_b$, $q_c$, and $q_d$ in accordance with TABLE I below.

TABLE I

| Data Pattern | $i_1$ | $i_2$ | $i_3$ | $q_a$ | $q_b$ | $q_c$ | $q_d$ |
|---|---|---|---|---|---|---|---|
| 1 | 0 | 0 | 0 | 0 | 0 | 0 | 0 |
| 2 | 0 | 0 | 1 | 0 | 0 | 0 | 0 |
| 3 | 0 | 1 | 0 | 0 | 0 | 0 | 0 |
| 4 | 0 | 1 | 1 | 0 | 0 | 1 | 0 |
| 5 | 1 | 0 | 0 | 0 | 0 | 0 | 0 |
| 6 | 1 | 0 | 1 | 0 | 1 | 0 | 0 |
| 7 | 1 | 1 | 0 | 1 | 0 | 0 | 0 |
| 8 | 1 | 1 | 1 | 0 | 0 | 0 | 1 |

In TABLE I, an entry of "0" in columns $i_1$–$i_3$ indicates a logical LOW state of the data read from the memory array. When the data is in the logical LOW state, the corresponding driver element does not conduct output current from the output data bus 102. Similarly, an entry of "0" in columns $q_a$–$q_d$ indicates a logical LOW state of the gate threshold voltage provided to the compensation legs. When a logical LOW signal is provided, the compensation legs are not coupled in parallel with the respective driver elements and, thus, also are not conducting output current.

As evident from TABLE I, compensation is not provided for data patterns in which none of the driver elements 262, 264, or 266 are conducting current (i.e., row 1 of TABLE I) or in which only one of the driver elements 262, 264, or 266 is conducting current (i.e., rows 2, 3, and 5 of TABLE I). However, compensation is provided when the data pattern is such that two or more of the driver elements are conducting current (i.e., rows 4, 6, 7, and 8 of TABLE I). Thus, legs 290 and 292 ($q_a$) are connected in parallel with driver elements 262 and 264, respectively, when both driver elements 262 and 264 are conducting output current (i.e., row 7). Legs 294 and 296 ($q_b$) are connected in parallel with driver elements 262 and 266, respectively, when both driver elements 262 and 266 are conducting output current (i.e., row 6). Legs 298 and 300 ($q_c$) are connected in parallel with driver elements 264 and 266, respectively, when they are both conducting output current (i.e., row 4). Legs 302, 304, and 306 ($q_d$) are connected in parallel with all of the driver elements 262, 264, and 266, when they all are conducting output current (i.e., row 8).

Figure 8:
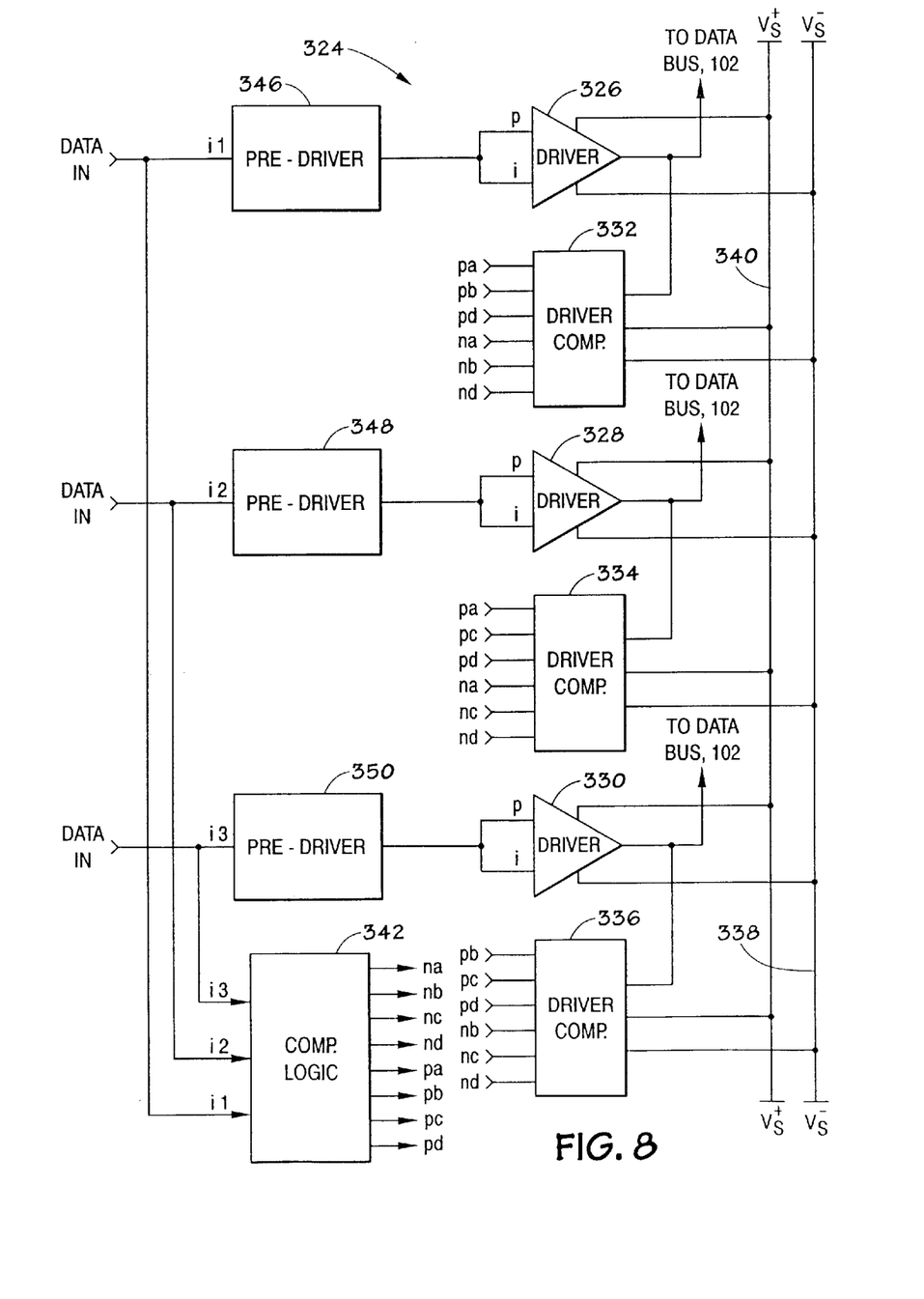
FIG. 8 illustrates a block diagram of another embodiment of a driver circuit with data-pattern-dependent compensation circuitry in accordance with the invention.

FIG. 8 illustrates yet another exemplary embodiment of a driver circuit 324, in which the various driver elements 326, 328, and 330 are configured as CMOS drivers driven by pre-drivers 346, 348, and 350, respectively. In this configuration, driver compensation elements 332, 334, and 336 include compensation legs for both the n-type FET and the p-type FET in each CMOS driver element. The n-type compensation legs are sized to compensate for data-pattern-dependent variations on the shared voltage bus 338 ($V_s^-$), while the p-type compensation legs are sized to compensate for data-pattern-dependent variations on the shared voltage bus 340 ($V_s^+$), such that the output current on the data bus 102 from each driver element 326, 328, and 330 is substantially constant regardless of the data pattern. The compensation logic 342 thus is configured to generate data-pattern-dependent output signals ($n_a$, $n_b$, $n_c$, $n_d$, $p_a$, $p_b$, $p_c$, and $P_d$) to selectively couple both the n-type and p-type compensation legs in parallel with the n-type FET and the p-type FET, respectively, in each driver element 326, 328, and 330.

Figure 9:
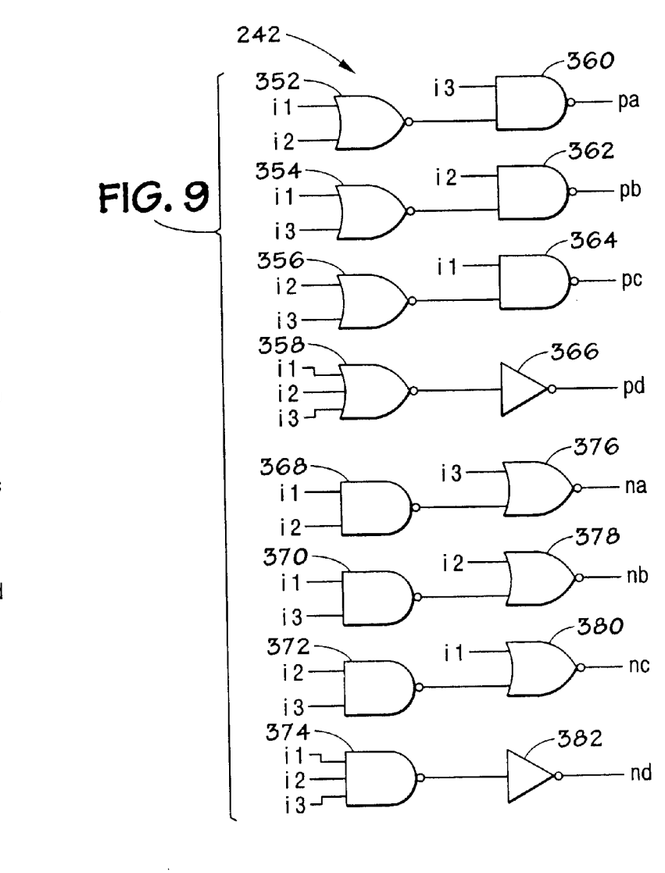
FIG. 9 illustrates an exemplary embodiment of compensation logic for the driver circuit of FIG. 8.

Exemplary compensation logic 342 for the driver circuit 324 of FIG. 8 is shown in FIG. 9. To provide the appropriate data-pattern-dependent output signals to selectively connect the p-type compensation legs in parallel with the p-type elements of the CMOS driver, the data signals $i_1$, $i_2$, and $i_3$ are provided to NOR gates 352, 354, 356, and 358, NAND gates 360, 362, and 364, and inverter/buffer 366. Similarly, to provide the appropriate data-pattern-dependent output signals to selectively connect the n-type compensation legs in parallel with the n-type elements of the CMOS driver, the data signals $i_1$, $i_2$, and $i_3$ are provided to NAND gates 368, 370, 372, and 374, NOR gates 376, 378, and 380, and inverter/buffer 382.

While the foregoing embodiments have been described with respect to open-drain FET drivers and CMOS drivers, it should be understood that the data-pattern-dependent driver compensation scheme is applicable to other types of drivers, including open-collector transistor drivers, booted NMOS drivers, etc. Further, it should be understood that the particular configuration of the driver compensation elements may vary, different numbers of compensation legs may be provided, and different relationships between the sizes of the compensation legs may be suitable. Still further, it should be understood that not all driver elements may have the same target value for output current. Likewise, the particular configuration and components which comprise the compensation logic may vary such that the compensation logic provides appropriate data-pattern-dependent output signals to selectively activate the driver compensation elements. Alternatively, it is contemplated that the overall compensation circuitry may be configured in different manners to maintain drive strength substantially constant for all data patterns. For example, the compensation circuitry may be configured to provide appropriate compensation based on monitoring the actual data-dependent changes in voltage applied to the various driver elements.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of maintaining drive strength of an output driver, the output driver comprising a plurality of driver elements, the method comprising the acts of:

driving, by a plurality of driver elements, a respective plurality of data signals out to an output bus, the plurality of data signals combining in a changing pattern, and wherein a varying amount of voltage is applied to each of the plurality of driver elements correlative to the changing pattern of data signals; and compensating for the varying amount of voltage applied to each of the plurality of driver elements, such that the drive strength of each of the plurality of driver elements is maintained substantially constant regardless of the changing pattern of data signals.

2. The method as recited in claim 1, comprising the act of reading the plurality of data signals from a memory array.

3. The method as recited in claim 1, wherein the act of compensating for the varying amount of voltage comprises selectively varying a resistance of each of the plurality of driver elements correlative to the varying pattern of data signals.

4. The method as recited in claim 1, wherein the act of driving the changing pattern of data signals comprises transitioning, by the plurality of driver elements, between a conductive state and a non-conductive state, and wherein the act of compensating for the varying amount of voltage is performed only when at least two of the plurality of driver elements are in the conductive state simultaneously.

5. The method as recited in claim 4, wherein the act of compensating for the varying amount of voltage comprises selectively varying a resistance of a respective driver element when the respective driver element is in a conductive state.

6. The method as recited in claim 1, wherein each of the driver elements comprises an open-drain FET.

7. The method as recited in claim 1, wherein the drive strength of each of the plurality of driver elements is maintained within a range of +/−1% regardless of the changing pattern of data signals.

8. The method as recited in claim 1, wherein the drive strength of each of the plurality of driver elements is constant regardless of the changing pattern of data signals.

9. The method as recited in claim 1, wherein the plurality of drivers elements are coupled to a shared voltage bus, and wherein the shared voltage bus applies the varying amount of voltage to each of the plurality of driver elements correlative to the changing pattern of data signals.

10. A driver circuit, comprising:
an input to receive a plurality of data signals, the plurality of data signals combining in a changing data pattern;
a first driver element having a first drive strength, the first driver element configured to drive a first data signal of the plurality of data signals out to a first output;
a second driver element having a second drive strength, the second driver element configured to drive a second data signal of the plurality of data signals out to a second output;
a shared voltage bus to apply a voltage to the first driver element and the second driver element, wherein a varying current flows on the shared voltage bus correlative to the changing data pattern, the varying current resulting in a variation in the voltage applied to the first driver element and the second driver element; and
a compensation circuit coupled to the first driver element and the second driver element, wherein the compensation circuit is configured to maintain the first drive strength and the second drive strength substantially constant despite the variation of the voltage applied to the first driver element and the second driver element.

11. The output driver as recited in claim 10, wherein the first drive strength and the second drive strength are the same.

12. The output driver as recited in claim 10, wherein the compensation circuit is coupled to the input, such that the compensation circuit maintains the first drive strength and the second drive strength substantially constant based on the changing data pattern of the plurality of data signals received at the input.

13. The output driver as recited in claim 11, wherein the compensation circuit comprises a first compensation element and a second compensation element, the compensation circuit being configured to selectively couple the first compensation element in parallel with the first driver element and the second compensation element in parallel with the second driver element based on the changing data pattern.

14. The output driver as recited in claim 12, wherein the compensation circuit is configured to vary the resistance of each of the first driver element and the second driver element based on the data pattern.

15. The output driver as recited in claim 10, wherein the first driver element comprises an open drain FET, and wherein the second driver element comprises an open drain FET.

16. The output driver as recited in claim 10, wherein the first driver element comprises a CMOS circuit, and wherein the second driver element comprises a CMOS circuit.

17. The output driver as recited in claim 10, wherein the first drive strength and the second drive strength are maintained with a range of +/−1% of a target level despite the variation of the voltage applied to the first driver element and the second driver element.

18. The output driver as recited in claim 10, wherein the first drive strength and the second drive strength are maintained at a target level despite the variation of the voltage applied to the first driver element and the second driver element.

19. A memory device, comprising:
a memory array to store data; and
a data output circuit to read the data from the memory array for output on to an output bus, the data comprising a least a first data signal and a second data signal combining in a changing data pattern, the data output circuit comprising:
a first driver element having a first drive strength, the first driver element configured to drive the first data signal out to a first output;
a second driver element having a second drive strength, the second driver element configured to drive the second data signal out to a second output;
a shared voltage bus to apply a voltage to the first driver element and the second driver element, wherein a varying current flows on the shared voltage bus correlative to the changing data pattern, the varying current resulting in a variation in the voltage applied to the first driver element and the second driver element; and
a compensation circuit coupled to the first driver element and the second driver element, wherein the compensation circuit is configured to maintain the first drive strength and the second drive strength substantially constant despite the variation of the voltage applied to the first driver element and the second driver element.

20. The memory device as recited in claim 19, wherein the first drive strength and the second drive strength are the same.

21. The memory device as recited in claim 19, wherein the compensation circuit is coupled to the input, such that the compensation circuit maintains the first drive strength and the second drive strength substantially constant based on the changing data pattern received at the input.

22. The memory device as recited in claim 21, wherein the compensation circuit comprises a first compensation element and a second compensation element, the compensation circuit being configured to selectively couple the first compensation element in parallel with the first driver element and the second compensation element in parallel with the second driver element based on the changing data pattern.

23. The memory device as recited in claim 19, wherein the compensation circuit is configured to vary the resistance of each of the first driver element and the second driver element based on the changing data pattern.

24. The memory device as recited in claim 19, wherein the first driver element comprises an open drain FET, and wherein the second driver element comprises an open drain FET.

25. The memory device as recited in claim 19, wherein the first driver element comprises a CMOS circuit, and wherein the second driver element comprises a CMOS circuit.

26. The memory device as recited in claim 19, wherein the memory device is a DRAM.

27. The memory device as recited in claim 19, wherein the first drive strength and the second drive strength are maintained with +/−1% of a target level despite the variation of the voltage applied to the first driver element and the second driver element.

28. The memory device as recited in claim 19, wherein the first drive strength and the second drive strength are maintained at a target level despite the variation of the voltage applied to the first driver element and the second driver element.

* * * * *